(12) United States Patent
Moore

(10) Patent No.: US 9,295,179 B2
(45) Date of Patent: Mar. 22, 2016

(54) RACKMOUNT LAPTOP SUPPORT

(76) Inventor: Graham Phillip Moore, Exeter (GB)

( * ) Notice: Subject to any disclaimer, the term of this patent is extended or adjusted under 35 U.S.C. 154(b) by 427 days.

(21) Appl. No.: 13/435,239

(22) Filed: Mar. 30, 2012

(65) Prior Publication Data
US 2012/0248049 A1 Oct. 4, 2012

(30) Foreign Application Priority Data

Mar. 30, 2011 (GB) ................ GB1105393.1

(51) Int. Cl.
*H05K 5/00* (2006.01)
*H05K 7/14* (2006.01)

(52) U.S. Cl.
CPC .................. *H05K 7/1494* (2013.01)

(58) Field of Classification Search
CPC ........ G06F 1/16; G06F 1/1601; G06F 1/203; G06F 1/1613; G06F 1/1633; G11B 33/127; G11B 33/123; G11B 33/02; H05K 7/1411; H05K 7/1488; H05K 7/183; H05K 7/18; H05K 5/00
USPC ........ 248/274.1, 276.1, 284.1, 918, 448, 462; 312/223.1, 223.2, 223.3, 208.1; 361/724, 725, 727
See application file for complete search history.

(56) References Cited

U.S. PATENT DOCUMENTS

| | | | |
|---|---|---|---|
| 4,355,779 A * | 10/1982 | Heled | 248/460 |
| 6,019,050 A * | 2/2000 | Ranta | 108/6 |
| 6,442,030 B1 | 8/2002 | Mammoser et al. | |
| 6,796,536 B1 | 9/2004 | Sevier | |
| 8,179,684 B2 * | 5/2012 | Smrha et al. | 361/756 |
| 8,272,602 B2 * | 9/2012 | Ye | 248/122.1 |
| 2005/0035262 A1 | 2/2005 | Seki et al. | |
| 2005/0173357 A1 | 8/2005 | McClain et al. | |
| 2010/0320354 A1 * | 12/2010 | Prost | 248/448 |
| 2013/0083471 A1 * | 4/2013 | Zhou | 361/679.31 |
| 2013/0327911 A1 * | 12/2013 | Russell | 248/276.1 |

FOREIGN PATENT DOCUMENTS

| | | |
|---|---|---|
| DE | 20019509 U1 | 5/2001 |
| DE | 10033658 A1 | 1/2002 |
| GB | 2360932 A | 10/2001 |
| WO | 2008/024185 A1 | 2/2008 |
| WO | 2010/098753 A1 | 9/2010 |

* cited by examiner

*Primary Examiner* — Steven Marsh

(57) ABSTRACT

A folding rack-mountable laptop support tray that can be fitted to a rack using 1 U or even 0 U of rack space, comprising a hinged or sliding bracket, connecting to a hinged or sliding arm, that supports a foldable tray comprising two cross-members, and two demountable supporting bars shown, or independent supports, when folded the unit fits in a laptop bag or rucksack to be carried until needed, the tray section being removable can be used as a desktop stand for a laptop to improve cooling.

18 Claims, 6 Drawing Sheets

Figure 1
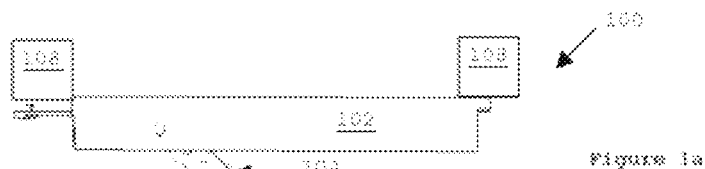
Figure 1a
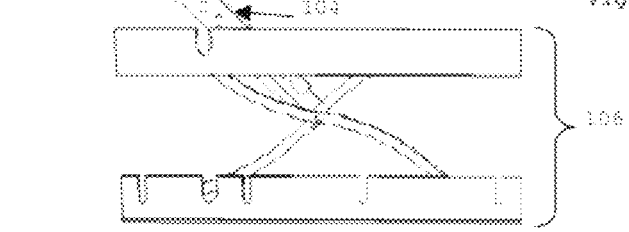
Figure 1b
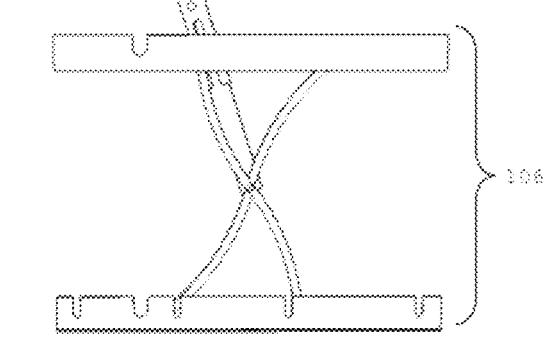
Figure 1c
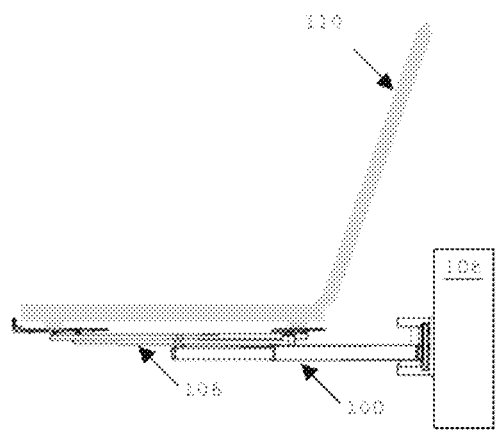
Figure 1d

RACKMOUNT LAPTOP SUPPORT

CROSS-REFERENCE TO RELATED APPLICATIONS

This application claims the benefit of U.K. Patent Application No. GB1105393.1, filed Mar. 30, 2011.

BACKGROUND OF THE INVENTION

This invention relates to rack mount cabinet accessories, specifically to supporting trays, shelves or platforms for mobile computing devices. Rack mount cabinets are used extensively throughout the IT industry in datacentres and office buildings to contain rack mount servers, data network and other ancillary equipment.

Rack mount cabinets are built to contain IT equipment having standard widths and brackets. The cabinets themselves currently come in two widths with the most common measuring 19" between the mounting rails and less commonly, measuring 23" between the rails. The mounting rails comprise two bars that have a series of holes that are either threaded to accept a bolt, or shaped to accept a captive nut which is held in place with a spring steel cage.

The holes in the rails are spaced in a repeating pattern of three holes which make up a standard rack measurement of 1 U. 1 U is defined as 1.75" in EIA-310, (Electronic Industries Alliance) and is common to both rack widths. 1 U Rack equipment is manufactured to be 1.719 inches in height to allow a gap between adjacent equipment for easy installation and removal.

This invention solves a problem of where to place a mobile computing device, such as a tablet computer or a laptop, when working on rack mounted equipment when there are no shelves or space available. Some racks have built in keyboards and screens, but these are usually found in server cabinets and generally connect through a dedicated KVM (Keyboard Video and Mouse) switch so are not of use for configuring devices using serial ports. Access through the serial port is usually done using a laptop to configure settings and troubleshoot connectivity issues.

Other cabinets may have shelves, but they are permanent fixings, and take up space in the rack that cannot be used for other equipment, also permanent shelves may not have the required space for a laptop with the screen open. Some racks do not have space for a laptop because they are simply full, of other equipment.

There is a pull out shelf available but this takes up 2 U of rack space and is a permanent fixing in the rack.

There is also a tripod based portable laptop stand that could be used, but it is free standing and will not fold to the size of this support. Free standing supports also take up floor space that can be at a premium in datacentre environments and they are susceptible to being knocked over.

BRIEF SUMMARY OF THE INVENTION

According to a first aspect of the invention, there is provided an apparatus for supporting equipment on a rack mount cabinet having rails, the apparatus comprising: a bar comprising means for reversible attachment to a rack mount cabinet; and a tray connected to the bar and configured to support the equipment; wherein, in use, the bar is attached to the rack mount cabinet and the tray is deployed so that the equipment may be supported when a user is working on rack mounted components, and after use the bar is removed from the rack mount cabinet.

Preferably, the bar has a length which is configured to be adjustable to fit the rack mount cabinet. This means that the apparatus can be used with racks of varying size.

Preferably, the bar comprises two parts, one part configured to slide within the other. This means that the length of the apparatus can be varied by sliding the parts to fit.

Preferably, one part of the bar has a U- or C-section. These are readily available.

Preferably, the section includes a groove along which the other part slides. This means that one piece can be slid within the other, whilst being retained in place.

Preferably, the bar comprises fixings able to engage with holes on the rails, wherein, in use, the bar is attached to the rack mount cabinet by means of the fixings. This means that the bar is ready for use.

Preferably, the fixings comprise a plurality of holes, wherein in use, the bar is attached to the rack mount cabinet by means of bolts or screws. This means that the bar can be attached to the rack mount using standard and readily available fittings.

Preferably, the holes are located in an end region of the bar. Holes allow the bar to be attached to the rack using bolts or screws.

Preferably, the fixings comprise one or more hooks able to engage with square holes on the rails. This means that the bar can be attached to the rack without any further fixing components being required.

Preferably, the one or more hooks are located in region of the bar adjacent an end region.

Preferably, the bar includes a cut-out for the one or more hooks, wherein in use one part of the bar may slide fully within the other. This means that the two parts of the bar can be slid into each other so that neither protrudes. It also means that the hook is unlikely to catch on anything.

Preferably, the tray is adjustable. This means that it can be made to fit a range of equipment.

Preferably, the tray comprises two cross members. Preferably, the cross members are connected by a pivot arrangement. This means that the cross members can be swiveled so that the support fits the equipment.

Preferably, the tray may be reversibly detached from the bar and the tray closed for storage. This means that the tray can be stored or carried separately from the bar, and may be used on its own as an equipment support, for example on a table.

Preferably, the pivot arrangement comprises a hole in a centre of each cross member each of the cross members and a tube located between the cross members engaging with each hole.

Preferably, the ends of each cross member each have a hole. Preferably, the tray comprises supports for the equipment, the supports each comprising a shaped bolt able to engage with a corresponding hole. Preferably, the shaped bolt can be used to adjust the height of the laptop supports, changing the angle of the tray if needed. This means that the orientation of the supports can be adjusted so that the equipment to be used is level.

Preferably, the tray comprises flat bars clipped to the supporting bolts. This means that smaller equipment may be used.

Preferably, the tray comprises one or more non-slip pads to support the equipment. This means that equipment is prevented from slipping from the tray.

Preferably, the height of the pads can be adjusted. This means that variations in level can be accommodated.

Preferably, the bar comprises an arm configured to connect to the tray. Preferably, the bar includes a pin for engagement with the arm, wherein, in use, the arm may swivel. Preferably, the pin forms part of a pivot. Preferably, the pin forms part of a hinge. This means that the position of the tray in relation to the bar may be adjusted.

Preferably, a length of the arm is adjustable. This means that a distance between the tray and the rest of the bar can be adjusted.

Preferably, the arm comprises two parts, one part configured to slide within the other. This means that the length of the arm may be adjusted.

Preferably, an outer part of the arm includes a series of holes used to locate the inner part of the arm by means of a spring clip or sprung mechanism protruding from a hole drilled in the inner part. This means that, once adjusted, the length of the arm may be fixed.

Preferably, the two parts comprise square section tube, one part being smaller and able to slide within the larger part.

Preferably, the smaller tube fits entirely within the larger tube when the apparatus is collapsed for storage or transport. This means that when not in use the arm has a compact size.

Preferably, the arm comprises a pin fitted at an end distal to the bar, wherein, in use the pin engages with the tray. This provides simple attachment between the tray and the rest of the apparatus.

Preferably, the arm includes a slot to accommodate the pin when the two parts of the arm are in a retracted position. This allows the arm to occupy a small space when not in use.

Preferably, when the apparatus is not in use, the cross members may be closed, and the arm swiveled, so that the arm and the cross members fit into an internal space formed by the U- or C-section part of the arm. This means that the apparatus, when collapsed or folded, is substantially the same size as the U- or C-section part, allowing for easy transport in a bag.

Preferably, the equipment is a mobile computing device. This means that the apparatus is suitable for use with, for example, a tablet computer.

Preferably, the mobile computing device is a laptop computer. This means that the apparatus is widely useful.

According to a second aspect of the invention, there is provided a tray comprising two cross members. This means that the tray is stable.

Preferably, the cross members are connected by a pivot arrangement. This means that the cross members can be swiveled so that the support fits the equipment.

Preferably, the pivot arrangement comprises a hole in a centre of each cross member each of the cross members and a tube located between the cross members engaging with each hole.

Preferably, the ends of each cross member each have a hole. Preferably, the tray comprises supports for the mobile computing device, the supports each comprising a shaped bolt able to engage with a corresponding hole. Preferably, the shaped bolt can be used to adjust the height of the laptop supports, changing the angle of the tray if needed. This means that the orientation of the tray can be adjusted so that the equipment to be used is level.

Preferably, the tray comprises flat bars clipped to the supporting bolts. This means that smaller equipment may be used.

Preferably, the tray comprises one or more non-slip pads to support the equipment. This means that equipment is prevented from slipping from the tray.

Preferably, the tray may be reversibly attached to a tray for supporting equipment on a rack mount cabinet having rails, the tray comprising a bar comprising means for reversible attachment to a rack mount cabinet and having a pin for engaging with the tray. This means that equipment may be supported when a user is working on rack mounted components, and after use the tray can be removed from the rack mount cabinet This invention is designed specifically to fit rack mount cabinets, provide a means of support for a laptop while working in the aforementioned cabinets, and to be easily fitted into a laptop bag or rucksack by folding or otherwise being collapsed, when not in use. The design allows easy fitting to and removal from the rack and can be fitted where there is no rack space by using extender brackets, (these are readily available on the open market or they can be supplied with, or even built in to the support).

The Rackmount Laptop Support is designed to fit in 1 U of rack space or 1.75 inches, and to fit standard equipment racks, from 19 to 24 inches in width, using either, a hinge, hinges or a sliding mechanism (as shown in FIGS. 1, 2, 6, 7, and 8).

Once fitted to the rack, the articulated arm folds out in a similar fashion to ordinary television support brackets using either a hinge or slider. The length of the arm being adjustable to suit the laptop, and work requirements.

At the free end of the arm is an adjustable tray comprising two cross members which can be positioned to support the laptop. The cross members are connected together in the middle and also connected to the free end of the support arm. At each end of each cross member there is an adjustable non slip pad to support the laptop. The height of the pads can be adjusted using a screw thread. The pad is large enough to provide adequate support for the laptop and also provide enough surface area to prevent slipping. Alternatively, the pads can be replaced with longer support arms that clip to the cross member arms providing a greater support area for the laptop if required.

The tray section of the bracket can be removed and have rubber feet fitted so the tray section can be used to support the laptop when in use on a table to improve airflow around and cooling for the laptop when in use.

BRIEF DESCRIPTION OF THE SEVERAL VIEWS OF THE DRAWING

For a more complete explanation of the present invention and the technical advantages thereof, reference is now made to the following description and the accompanying drawing in which:

FIG. 1*a*, shows a representation of the present invention from the top being partially opened. FIG. 1*b* shows the same view but with the adjustable bar and cross-members being further extended. FIG. 1*c* shows the present invention from the front elevation. FIG. 1*d* shows a side view with a representation of a laptop being supported by the structure

DETAILED DESCRIPTION OF THE INVENTION

Figure 2:
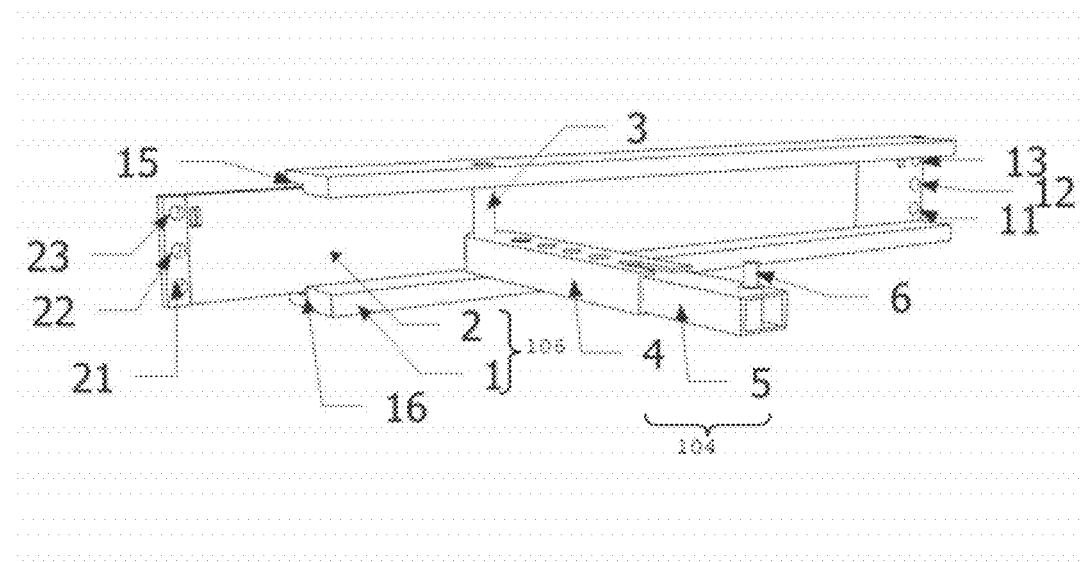
FIG. 2, shows the slider mechanism, connected to the support arm.

Embodiments of the present invention and their technical advantages may be better understood by referring to FIGS. 1 to 11.

FIG. 1*a* shows an apparatus 100 for supporting a mobile computing device on a rack mount cabinet having rails, and which comprises bar 102, arm 104 pivotally connected to bar 102, and support 106 connected to arm 104. Bar 102 has fixing means for demountable attachment to two rails 108 of a rackmount cabinet. The fixing means can be at or near each end of bar 102. The distance between the fixing means is chosen so as to fit the dimensions of the cabinet, for example, 19 inches or 23 inches between the mounting rails. Bar 102 can be demountably attached to two rails at the front of the cabinet, in which case bar 102 is disposed across the front side of the cabinet, or the two rails at the left or right side of the cabinet, in which case bar 102 is disposed along one of the sides of the cabinet. Arm 104 is able to pivot between a storage position in which it is aligned adjacent to and along a length of bar 102 and a deployed position in which it extends away from bar 102. When bar 102 is attached to the cabinet, arm 104 pivots in a horizontal plane with respect to the vertical rails of the cabinet.

FIG. 1*b* shows an embodiment in which the length of arm 104 can be adjusted to increase the distance between the rackmount cabinet and support 106.

FIG. 1*d* shows apparatus 100 deployed to support mobile computing device 110, in this case a laptop, on support 106.

Figure 3:
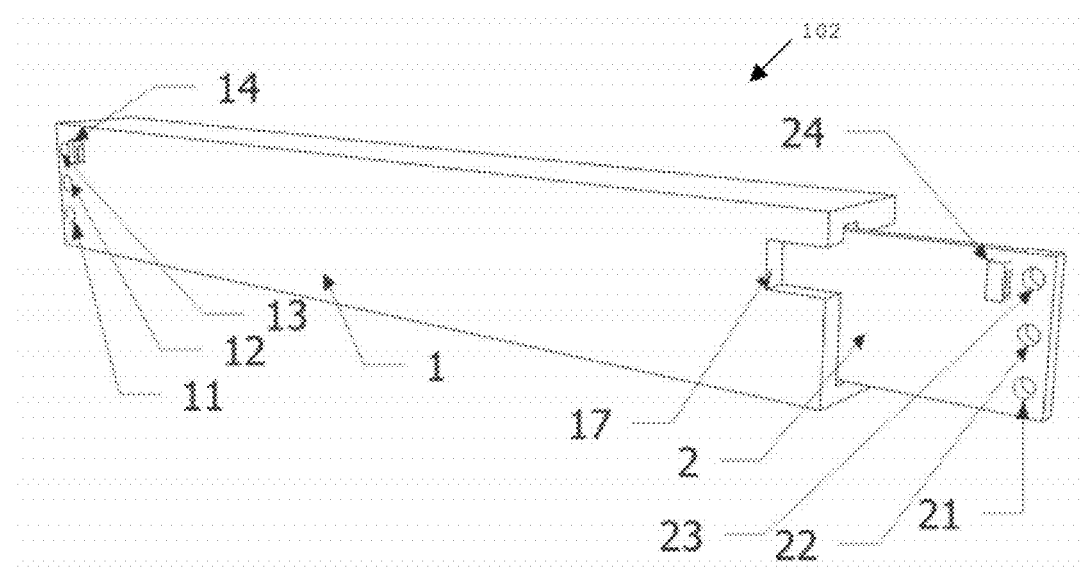
FIG. 3, shows the rear of the sliding bracket.

FIG. 3 shows an embodiment of the invention in which bar 102 is comprised of a first part 1 and a second part 2 which slide with respect to each another so that a distance between fixing means 21,22,23 and fixing means 11,12,13 can be adjusted to fit a 19 inch rack, a 23 inch rack, or any other size of rack. The fixing means can be located at or near each end of bar 102.

Figure 4:
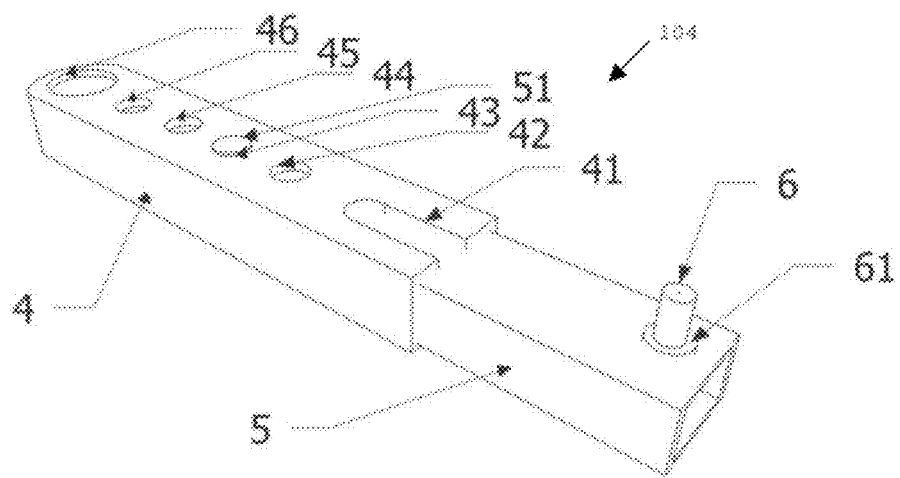
FIG. 4, shows the extendable support arm with the locating pin and front pin fitted.

FIG. 4 shows an embodiment of the invention in which arm 104 is comprised of two parts which slide with respect to one another so that a length of arm 104 can be adjusted.

FIG. 2 shows arm 104 connected to bar 102. Bar 102 comprises two sliding sections 1,2. Sliding section 1 can be made from a U or C section bar, which can include channels 15,16 machined top and bottom so that section 2 slides within the channels, but is held securely such that the two parts cannot be separated when bolted to the rack. When in the closed position, the length of bar 102 can be 14 inches, but can be extended to fit 24 inch racks by sliding sections 1 and 2 relative to each other.

Fixing means are located towards each end of bar 102 for detachable connection to the rack. FIG. 2 shows one set of holes 11,12,13 on section 1 of bar 102, and another set of holes 21,22,23 on section 2 of bar 102; these are drilled to the same pattern as the rack rails such that they facilitate mounting of bar 102 on the rack by means of bolts or screws. FIG. 3 shows a rear view of the structure of bar 102 in which hook 14 on section 1 and hook 24 on section 2 can be used on racks with square holes (and some others) for rapid fitting, without the need to use bolts. The hooks need to be far enough in so when the support is fixed using screws and the holes, the hooks do not foul the rack. Cut-out 17 in section 1 allows sections 1 and 2 to be flush at both ends when in bar 102 is in a closed position.

FIG. 2 shows a pin 3 fitted off-centre in holes drilled in the top and bottom of the sliding bar made from the C-section. Pin 3 is used to firmly connect to arm 104. Arm 104 is of two-part construction, a smaller part 5 sliding within the larger part 4, and rotates about pin 3. Smaller part 5 fits entirely within the larger part 4 when in the closed position. Smaller part 5 has pin 6 fitted at the free end which has shoulder 61 as can be seen in FIG. 4, and which supports two cross members 7,8, as shown in FIG. 5.

FIG. 4 shows hole 46 drilled in larger part 4 to receive pin 3. A series of holes 42,43,44,45 are used to locate the smaller part 5 by means of spring clip or sprung mechanism 51 protruding from a hole drilled in smaller part 5. FIG. 4 also shows slot 41 machined in the larger part 4 to accommodate pin 6 when parts 4,5 are in the retracted position.

Figure 5:
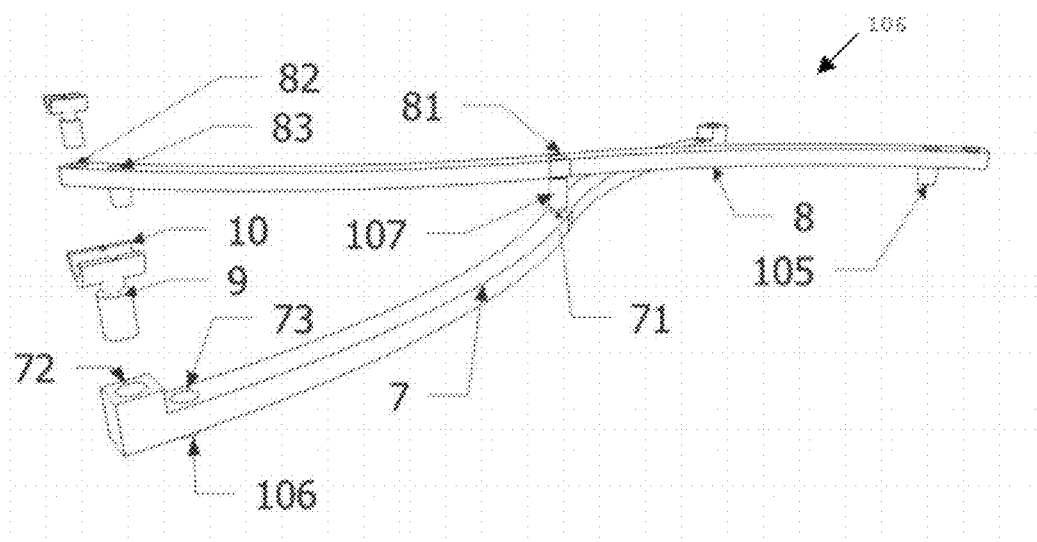
FIG. 5, shows an exploded view of the cross-members with the independent supports, removable feet and hollow connecting tube.

Cross members 7,8 seen in FIG. 5, in turn support tray support pieces 9,10 at each end or the cross members. Each of the cross members has a hole 71,81 in the centre through which hollow tube 107 is fitted. The tube is a push fit in the lower member, but not the upper, so the upper cross member is free to rotate around it. Tube 15 fits over pin 6 when used to support a laptop in the rack, but holds the cross members together, when removed from the pin. At the end of each arm are two threaded holes. Outer hole, 72, 82 is used to accept shaped bolt 9. Inner threaded hole 73, 83 is used to fit feet 105, 106 when being used as a desk stand. Shaped bolt 9 can be used to adjust the height of the laptop supports, changing the angle of the tray if needed. The bolts have a round ball at the top so the pads that support the laptop can be clipped on, and changed easily if required.

Figure 6:
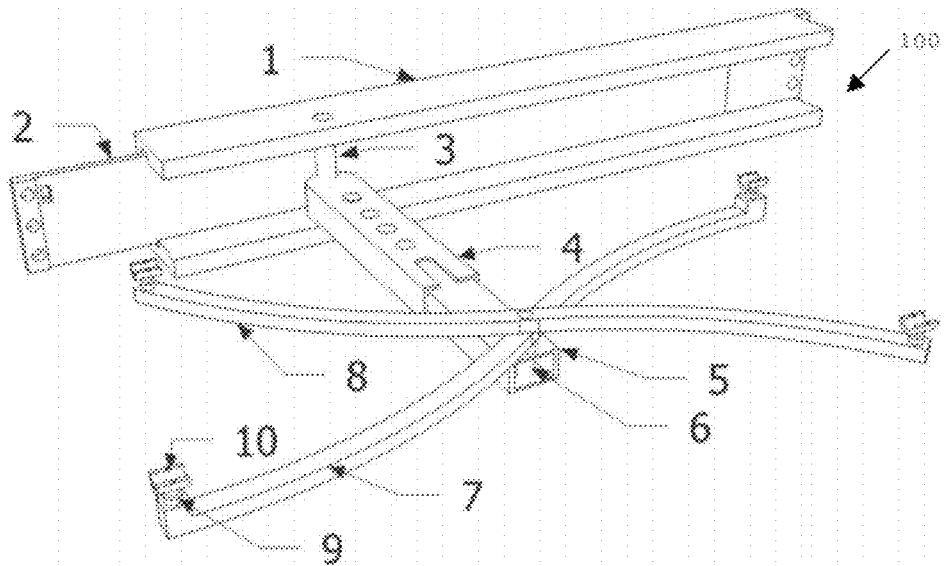
FIG. 6, shows the complete structure fitted with the independent laptop supports.

FIG. 6 shows the complete structure fitted with the independent laptop supports and having the major components numbered.

Figure 7:
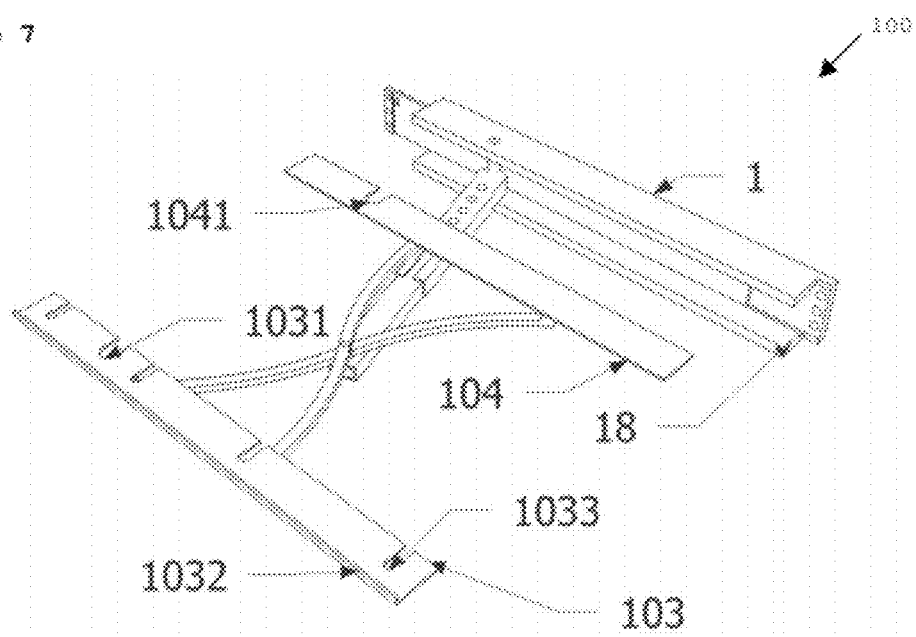
FIG. 7, shows the complete structure from another angle fitted with the alternative support bars.

FIG. 7 shows the complete structure fitted with the alternative laptop supports that comprise two flat bars 103,104 clipped to the supporting bolts. The bar furthest from the rack, (at the front of the laptop when in normal use) has a small raised edge 1032 at the front to stop the laptop sliding forward when supported by the tray. Both bars have cut out 1031, 1041 that fits around pin 3 when the mechanism is in the closed position, and front bar 103 has additional cut-outs 1033 to fit round the supports, also when in the closed position. There is a cut-out 18 so that the support can be mounted in the rack back to front such that the tray can be used to support a laptop inside the rack, (as well as outside).

Figure 8:
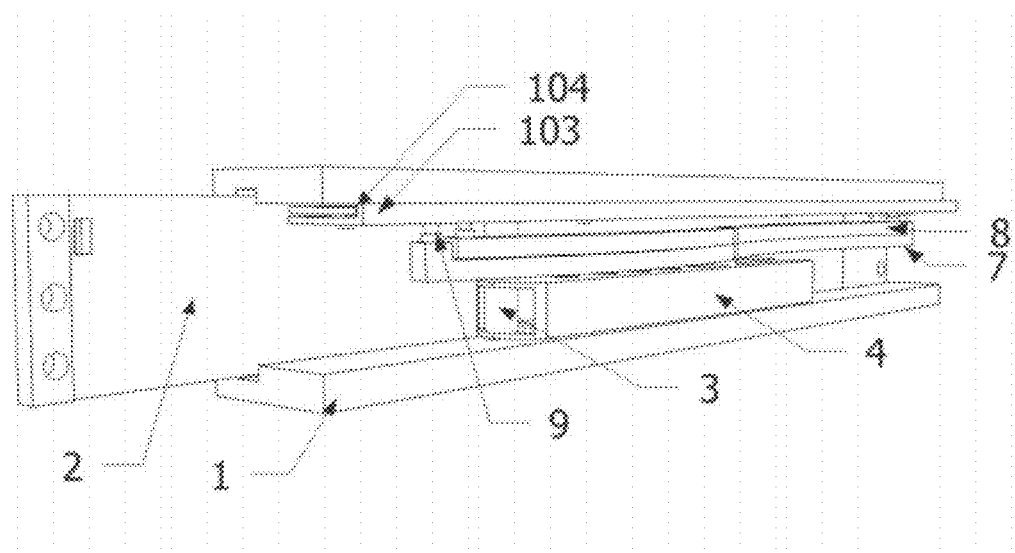
FIG. 8, shows the complete structure with the flat bars fitted in the folded position.

The complete structure can be seen in the folded position in FIG. 8, with some of the major components numbered.

Figure 9:
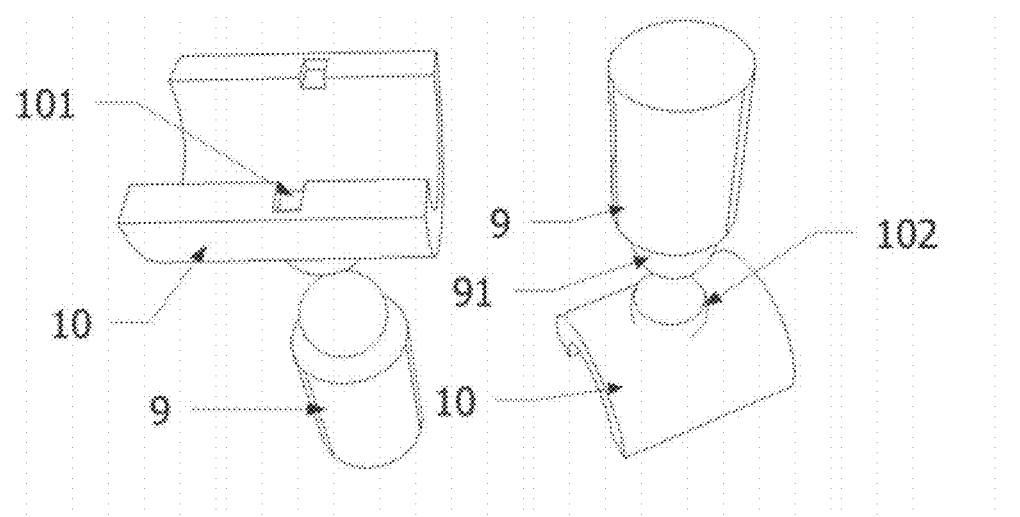
FIG. 9, shows a close up of the adjustable (threaded) post, and the independent laptop supports.

Shaped supporting bolts 9 and independent tray supports 10 can be seen in more detail in FIG. 9. Laptop supports 10 are shaped to accept various shapes of laptop feet either in indents 101 or in the body of the support. There is a shaped receptacle 102 that is part of the laptop support moulding that clips to the turned ball 91 on the threaded bar 9.

Figure 10:
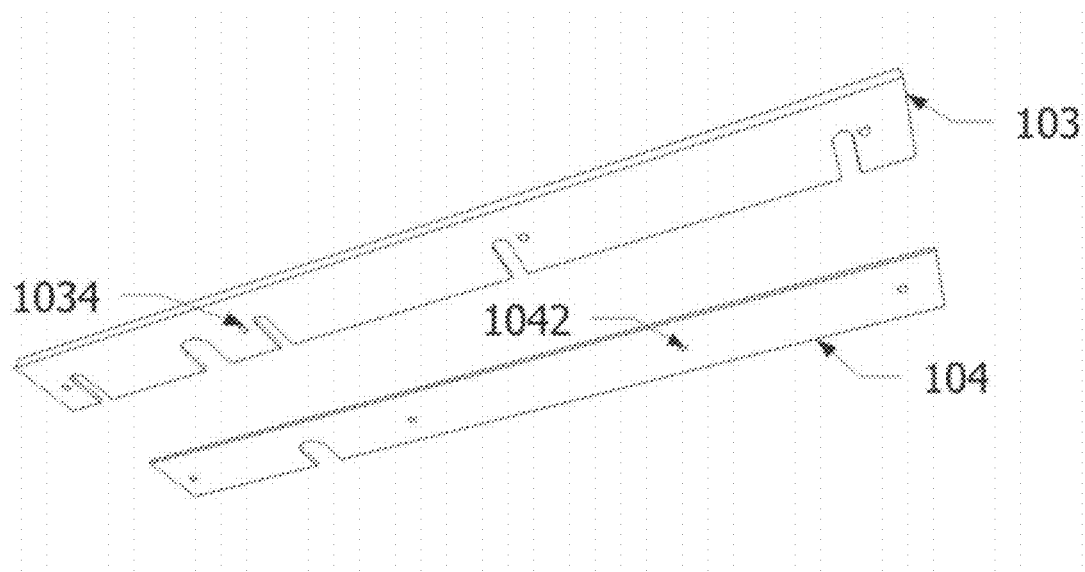
FIG. 10, shows the alternative laptop support bars from the underside.
Figure 11:
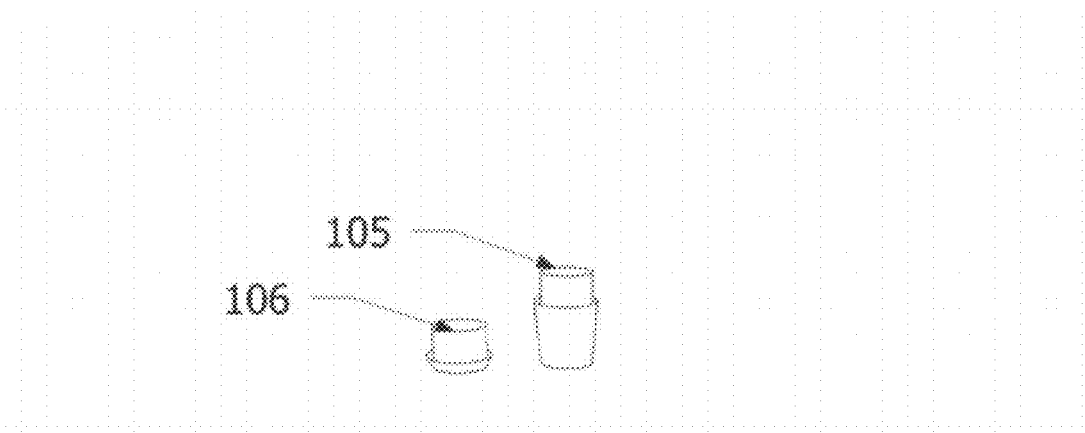
FIG. 11, shows the feet for the crossmembers.

Flat bars 103, 104 are used as alternative laptop supports can be seen in more detail in FIG. 10. Each bar has a number of shaped receptacles 1034, 1042 designed to clip to turned ball 91 shown in FIG. 9. The position of the flat bars can be adjusted by using different receptacles when in use.

The cross members can be removed from the supporting arm to be used as a desk support for a laptop, helping to improve airflow when used on a desk. Feet 105,106 can be seen in more detail in FIG. 11.

In use, the bar is attached to the rack mount cabinet and the tray is deployed so that the equipment may be supported when a user is working on rack mounted components, and after use the bar is removed from the rack mount cabinet.

In a further embodiment, the invention is an apparatus for attaching a tray for a mobile computing device to a rack mount cabinet having rails. The apparatus includes a bar having fixing means for demountable attachment between two of the rails, and an arm pivotally connected at one end to the bar. The arm is adapted to connect to the support tray. The arm can pivot between a storage position adjacent to the bar and a deployed position away from the bar, and a length of the arm is adjustable.

The invention claimed is:

1. An apparatus for supporting a mobile computing device on a rack mount cabinet having vertical mounting rails, said apparatus comprising:
a bar having fixing means for demountable attachment between two of said rails, wherein said fixing means are located at or near each end of said bar, and wherein a distance between the fixing means is equal to a distance between said mounting rails; an arm pivotally connected at a first end to said bar, the arm pivoting in a substantially horizontal plane when the said bar is demountable attached; and a tray connected to a second end of said arm; wherein said arm can pivot between a storage position adjacent to said bar and a deployed position away from said bar, and wherein a length of said arm is adjustable.

2. The apparatus of claim 1 wherein said bar comprises a first part and a second part, said second part to slide within said first part, wherein a distance between said fixing means is adjustable.

3. The apparatus of claim 1 wherein, in use, said fixing means engage with holes on said rails.

4. The apparatus of claim 3 wherein said fixing means comprise one or more hooks able to engage with square holes on said rails.

5. The apparatus of claim 4 wherein said bar includes a cut-out for said one or more hooks, wherein in use one part of said bar may slide fully within said other.

6. The apparatus of any claim 1 wherein said arm comprises two parts, one part configured to slide within said other.

7. The apparatus of claim 6 wherein an outer part of said arm includes a series of holes used to locate said inner part of said arm by means of a spring clip or sprung mechanism protruding from a hole drilled in said inner part.

8. The apparatus of claim 6 wherein said two parts comprise square section tube, one part being smaller and one part being larger, said smaller part being able to slide within said larger part.

9. The apparatus of claim 8 wherein said smaller part fits entirely within said larger part when said apparatus is collapsed for storage or transport.

10. The apparatus of claim 6 wherein said arm includes a slot to accommodate a pin when said two parts of said arm are in a retracted position.

11. The apparatus of claim 1 wherein said tray is demountably connected to said arm.

12. The apparatus of claim 1 wherein said tray comprises two cross members.

13. An apparatus for attaching a tray for a mobile computing device to a rack mount cabinet having vertical rails, said apparatus comprising:
a bar having fixing means for demountable attachment between two of said rails, wherein said fixing means are located at or near each end of said bar, and wherein a distance between the fixing means is equal to a distance between said mounting rails; and an arm pivotally connected at a first end to said bar, the arm pivoting in a substantially horizontal plane with respect to the vertical rails of the cabinet when the bar is attached to the cabinet, said arm adapted at a second end to connect to said support tray wherein said arm can pivot between a storage position adjacent to said bar and a deployed position away from said bar, and in which a length of said arm is adjustable.

14. The apparatus of claim 13 wherein said bar comprises a first part and a second part, said second part to slide within said first part, wherein a distance between said fixing means is adjustable.

15. The apparatus of claim 13 wherein, in use, said fixing means engage with holes on said rails.

16. The apparatus of claim 15 wherein said fixing means comprise one or more hooks able to engage with square holes on said rails.

17. The apparatus of claim 16 wherein said bar includes a cutout for said one or more hooks, wherein in use one part of said bar may slide fully within said other.

18. The apparatus of claim 13 wherein said arm comprises two parts, one part configured to slide within said other.

\* \* \* \* \*